United States Patent [19]

Interrante et al.

[11] Patent Number: 5,288,007
[45] Date of Patent: Feb. 22, 1994

[54] APPARATUS AND METHODS FOR MAKING SIMULTANEOUS ELECTRICAL CONNECTIONS

[75] Inventors: Mario J. Interrante, New Paltz; Michael Berger, Gardiner; Edward F. Handford, Wurtsboro; Eugene Tas, Stanfordville, all of N.Y.

[73] Assignee: International Business Machine Corporation, Armonk, N.Y.

[21] Appl. No.: 996,366

[22] Filed: Dec. 23, 1992

Related U.S. Application Data

[60] Continuation of Ser. No. 849,864, Mar. 12, 1992, abandoned, which is a division of Ser. No. 771,706, Oct. 19, 1991, Pat. No. 5,193,732.

[51] Int. Cl.⁵ .............................................. B23K 20/10
[52] U.S. Cl. .................................... 228/119; 228/111; 228/205; 228/180.21; 228/179.1
[58] Field of Search .............. 228/1.1, 4.5, 179, 119, 228/110, 111, 205, 180.2

[56] References Cited

U.S. PATENT DOCUMENTS

| | | | |
|---|---|---|---|
| 3,274,331 | 9/1966 | Quigley | 228/56.3 |
| 3,396,892 | 8/1968 | Balamuth | 228/1.1 |
| 3,406,246 | 11/1968 | Davidson et al. | 228/119 |
| 3,458,102 | 7/1969 | Zanger et al. | 228/6.2 |
| 3,463,898 | 8/1969 | Takaoka et al. | 219/121.63 |
| 3,535,769 | 10/1970 | Goldschmied | 228/56.3 |
| 3,568,307 | 3/1971 | Zanger et al. | 228/179 |
| 3,690,538 | 9/1972 | Gaiser et al. | 228/4.5 |
| 3,695,502 | 10/1972 | Gaiser | 228/4.5 |
| 3,762,040 | 10/1973 | Burns et al. | 29/593 |
| 3,955,740 | 5/1976 | Shoh | 228/1.1 |
| 4,030,657 | 6/1977 | Scheffer | 228/1.1 |
| 4,184,623 | 1/1980 | Strasser | 228/180.2 |
| 4,247,590 | 1/1981 | Hayakawa | 428/210 |
| 4,259,367 | 3/1981 | Dougherty, Jr. | 427/96 |
| 4,418,264 | 11/1983 | Thorwarth | 29/402.16 |
| 4,442,966 | 4/1984 | Jourdain et al. | 228/123 |
| 4,630,355 | 12/1986 | Johnson | 29/593 |
| 4,667,867 | 5/1987 | Dobbs et al. | 228/44.7 |
| 4,683,652 | 8/1987 | Hatfield | 29/829 |
| 4,691,855 | 9/1987 | Yagi | 228/4.5 |
| 4,776,509 | 10/1988 | Pitts et al. | 228/179 |
| 4,778,097 | 10/1988 | Hauser | 228/44.7 |
| 4,781,319 | 11/1988 | Deubzer et al. | 228/4.5 |
| 4,908,938 | 3/1990 | Thorwarth | 29/846 |
| 4,912,843 | 4/1990 | Dederer | 228/119 X |
| 4,952,257 | 8/1990 | Forler | 156/94 |
| 4,967,950 | 11/1990 | Legg et al. | 228/180.2 |
| 4,970,365 | 11/1990 | Chalco | 219/121.63 |
| 5,079,070 | 1/1992 | Chalco et al. | 156/233 X |

FOREIGN PATENT DOCUMENTS 270245 12/1991 Japan ................................ 228/179
1016854 4/1984 U.S.S.R.

OTHER PUBLICATIONS

*Semiconductor International* "Discrete Wire Bonding Using Laser Energy" by Chaleo et al May 1988 pp. 130–131.

Avedissian "Multidirectional Ultrasonic Wire bonding Tip" Tech. Digest No. 20 (Western Electric), Oct. 1970, pp. 7–8.

Fowler "Double Element Bonding Head" Tech Digest No. 12 (Western Electric) Oct. 1968; p. 9.

(List continued on next page.)

*Primary Examiner*—Kenneth J. Ramsey
*Attorney, Agent, or Firm*—Aziz M. Ahsan

[57] ABSTRACT

The present invention relates generally to apparatus and methods for making simultaneous electrical connections, and more particularly to making these electrical connections simultaneously using a new bond tip configuration. Various methods and processes are being disclosed to simultaneously make electrical connections between electrical conductor lines or pads. The electrical connection is made by placing an electrically conductive wire across a pair of electrical lines or pads that have to be electrically connected and then by using a special tip, both ends of the electrically conductive wire are simultaneously secured to the two electrically conductive lines or pads.

19 Claims, 4 Drawing Sheets

OTHER PUBLICATIONS

IBM TDB, vol. 8, No. 11, Apr. 1966, p. 1469, "Repairing Breaks in Printed Circuits".
IBM TDB, vol. 11, No. 7, Dec. 1968, p. 876, "Solder Coating Thin Copper Wire".
IBM TDB, vol. 14, No. 5, Oct. 1971, p. 1359, "Soldering Device".
IBM TDB, vol. 14, No. 10, Mar. 1972, p. 2915, "Open Conductor Repair for Glass Metal Module".
IBM TDB, vol. 15, No. 8, Jan. 1973, p. 2423, "Conductive Line Jumper/Repair connection in Glass Metal Module".
IBM TDB, vol. 16, No. 4, Sep. 1973, p. 1153 "Flexible Circuit Package for Mechanical Thermal Pulse Bonding".
IBM TDB, vol. 18, No. 12, May 1976, p. 3984, "Individually Controllable Wire Solder Reflow Bonding Tip".
IBM TDB, vol. 22, No. 9, Feb. 1980, pp. 3986–3987, "Circuit Repair/work of Metalized Polyimide Substrates".
IBM TDB, vol. 26, No. 12, May 1984, pp. 6244–6245, "Josephson Package Repair".
IBM TDB, vol. 27, No. 5, Oct. 1984, p. 3401, "Thermo–Compression Bonding
IBM TDB, vol. 29, No. 2, Jul. 1986, pp. 720–721, "Automatic Soldering Machine for Fine-Wire Connections".
IBM TDB, vol. 31, No. 2, Jul. 1988, pp. 312–313, "Automated Point-to-Point Soldering Workstation".
IBM TDB, vol. 31, No. 6, Nov. 1988, pp. 236–237, "Equal Force Planarity Device".
IBM TDB, vol. 32, No. 4A, Sep. 1989, pp. 429–430, "Ablative Cleaning of Bonding Surfaces".
Micro–Swiss/Bonding Tools and Production Accessories, 1980, "Tailless Ball and Wedge Bonding Cycle", Ultrasonic Bonding Wedges; Die Collets.
Bonding Tools, 1977, pp. 18–21, "Part Two: Bonding Wedges" Gaiser Tool Company.
"Thermocompression Bonding Manual", 1976, pp. 4–11, Gaiser Tool Company.
U.S. patent application Ser. No. 07/725,415 filed on Jul. 1, 1990 entitled "Localized Soldering Station Using State Changing Medium".
Technical Digest No. 20 (Western Electric), Oct. 1970, pp. 7–8, "Multidirectional Ultrasonic Wire Bonding Tip", Avedissian.
Technical Digest No. 12 (Western Electric), Oct. 1968, p. 9, Fowler, W. H., "Double Bonding Head".

APPARATUS AND METHODS FOR MAKING SIMULTANEOUS ELECTRICAL CONNECTIONS

This application is a continuation of application Ser. No. 07/849,864, filed Mar. 12, 1992, abandoned, which is a division of U.S. patent application Ser. No. 07/771,706, filed on Oct. 4, 1991, now U.S. Pat. No. 5,193,732.

CROSS-REFERENCE

This Patent Application is related to U.S. patent application Ser. No. 07/771,707, entitled "Direct Distribution Repair and Engineering Change System," filed concurrently on Oct. 4, 1991, and which is assigned to the same assignee as this Patent Application, and the disclosure of it is incorporated herein by reference.

FIELD OF THE INVENTION

The present invention relates generally to apparatus and methods for making simultaneous electrical connections, and more particularly to making these electrical connections simultaneously using a new bond tip configuration. Various methods and processes are being disclosed to simultaneously make electrical connections between electrical conductor lines or pads. The electrical connection is made by placing an electrically conductive wire across a pair of electrical lines or pads that have to be electrically connected and then by using a special tip, both ends of the electrically conductive wire are simultaneously secured to the two electrically conductive lines or pads.

BACKGROUND OF THE INVENTION

With the advent of modern day electronics, the circuits on a PCB (Printed Circuit Board) or modules or chips have become more and more dense. As a result the electrical lines or conductor lines and terminals or pads have become smaller so that more of them can be placed in a given area.

It therefore becomes necessary to make increasingly smaller electrical connections between these lines and pads to complete electrical functionality. The increased density of these electrical connections increases the probability that the conductor lines or paths will have to be rerouted.

The rerouting of the conductor lines are among the most important steps in the packaging technology. This is because the electronic hardware must be reliable and free from defects, as they are very expensive to manufacture and field failures cannot be repaired easily. In addition, due to the large size of the package (tens of millimeters), which supports a large area interconnection between silicon or other devices, it is not practical to isolate and throw away the defective part of the package, as is commonly done in the manufacture of silicon chips. To eliminate these immediate and potential defects, tremendous efforts are being made.

This rerouting of electrical wires is done for a variety of reasons. The first and foremost reason is for the purpose of E.C. (Engineering Change), which customizes a part for a particular performance requirement. Other reasons for re-routing electrical wires are defects or cracks in lines, or shorts between lines. Defects or faults in a conductor line could be due to masking or improper deposition of the conductive material. But they could also be related to other factors, such as impure material or stretching the resolution limits of the lithography process. The thin film redistribution lines may have opens due to contamination, process mishaps and physical damage.

Another reason for opens is due to stresses generated during thermal cycles in device attach and test processes used during assembly of PCB or ceramic modules. The thin film lines with cracks and other latent defects may develop opens. These opens could either be repaired or the signal line rerouted in order to use the substrate or module or package which would otherwise be electrically defective.

Particularly, in the thin film processing, the thin film redistribution and other interconnection lines are susceptible to defects which could result in the lines being electrically open. Defects could include voids, missing metal, various particle contamination or physical damage. A redundant metal scheme helps to substantially reduce the number of defective lines, but this scheme does not eliminate them entirely. Those lines identified as "open" after thin film electrical test can be repaired by processes such as laser CVD (Chemical Vapor Deposition) prior to a polyimide overcoat process. Occasionally an "open" line will go undetected through test or becomes "open" during subsequent thermal processing. These defective conductors appear in the module or substrate, after pins, capacitors and chips are joined If an "open" line should be found at this point, it is essential to repair the defect so that the module or the substrate or the package can be used.

Recently non-destructive electrical testing methods (for example, NLC (Nonlinear Conductivity) tester as disclosed in U.S. Pat. No. 4,496,900) have been developed. The NLC tester locates the lines with current constricting defects, such as, cracks, line breaks, intermittent opens, narrow necks, etc. The method of high pulse current, as discussed elsewhere, can then be used to open up the defects. This process is utilized due to the fact that it is easier to visually locate the complete opens than latent defects.

It is disclosed in, "Repairing Breaks in Printed Circuits," IBM Technical Disclosure Bulletin, Vol. 8, No. 11, Page 1469 (April 1966), that small breaks in a line can be repaired by filling the gap in the broken line with a material that is cured at room temperature or higher to form a base conductive material. A conductive metal layer is then electroplated over the base conductive material to complete the repair. Using this process would require that lines to be repaired, on extremely dense packages with chips, capacitors and discrete wires in place, be isolated during electroplating. This would create significant handling and tooling problem.

"Open Conductor Repair For Glass Metal Module," IBM Technical Disclosure Bulletin, Vol. 14, No. 10, Page 2915 (March 1972), discloses another method of making open repairs. Here a metal line to be transferred is aligned over the open or break, and using a laser beam, a portion of the metal layer is welded to each end of the broken line. This article also teaches that the line could be reflowed into the break using a laser or it could be evaporated into the break. Each of these features cannot be used with the present invention, because the melting of high temperature conductive metals, such as copper, is used. Energy required to melt such lines by laser would damage polyimide adjacent to the lines to be repaired.

Another disclosure entitled "Welding Device Utilizing Laser Beams" U.S. Pat. No. 3,463,898 (1966) describes the simultaneous plural spot melting of metal and metal alloys of Al, Au and Ni, etc. By using a split beam laser focused onto two different spots on an electrode, the entire metal electrode becomes hot. Although the melting does occur simultaneously, the temperatures involved in melting the metals and metal alloy ranges from 600° C. to 1400° C. These temperatures are so high they would not only destroy the adhesion interface between the metal bond tabs and the polymer structure below it but would probably melt or deform several of the multilevel polymer and thin film layers below the bond tabs of this invention.

Many types of electrical connections and connection processes have been disclosed, for example, U.S. Pat. No. 3,762,040 entitled "Method of Forming Circuit Crossovers" discloses elaborate fabrication of compression formed semicircular terminals (35–80 mils long) which are gold plated and laminated in a press at 800 Psi and 340° C. to transfer the ends of the crossovers from their carrier to functional lines. These process features could not be used with the present invention due to the macro size (35–80 mils) and the compression bonding parameters like 340° C. temperature which would distort the polymer structure surrounding the bond tabs in the present invention.

A rather complex process for repairs of opens is disclosed in U.S. Pat. No. 4,259,367 (Dougherty, Jr.), where a conductor patch line is interconnected onto a good line through an insulating layer. This requires the addition of new wiring layers with photolithographic techniques which would be incompatible with a substrate with components already in place.

Another method of repairing opens is by decal transfer as disclosed in U.S. Pat. No. 4,704,304 (Amendola, et al.), and presently assigned to IBM Corporation.

Another method of electric circuit line repairs is taught in U.S. Pat. No. 4,630,355 (Johnson). A layer of phase-change material is deposited prior to the deposition of the conductive line and in case an open results in the conductive line, a current is passed through the phase-change material so that a portion of it becomes electrically conductive and makes an electrical bridge across the gap or open. This method is not suitable for repairs on polyimide films due to lack of adhesion of such phase-change materials to polyimide.

In U.S. Pat. No. 4,418,264 (Thorwarth), a specifically shaped metallic part is placed on the conductor path interruption and by means of micro-resistance welding, the metallic part is welded to the conductor to bridge the interruption. Welding involves melting of the repair material which when used on current "state of the art" thin film polymer packages could cause structural damage to the polymer. Welding also requires the passage of high drive currents which would be incompatible with this invention as there are active devices which are connected to the lines being repaired at different locations, and with the high drive current these active devices would be damaged.

Another method of repairing opens and narrow necks has been disclosed in U.S. Pat. No. 4,919,971 (Chen). The defective site in the conductor line having a thin portion or a narrow neck does not have to be physically located to initiate the repairs. The process is self-induced, i.e., the passage of the drive current creates a hot spot at the defective site and conductive material is induced to be deposited at the defective site. This process is also self-limiting, i.e., when the defect has been repaired, the process will slow down and stop by itself. This technique requires the substrate to be immersed in a plating bath or be exposed to organometallic vapors which would make it incompatible with line repair processes where the active and passive components have already been mounted on the substrate.

"Conductive Line Jumper/Repair Connection in Glass Metal Module," IBM Technical Disclosure Bulletin, Vol. 15, No. 8, Page 2423 (January 1973), discloses another method of making open repairs. Here after the open has been located, a wire is placed across the open line and the wire is welded to each end of the open line. After welding the repaired plane is glassed over leaving a surface suitable for developing another circuit layer. This process teaches the repairs of the carrier at the build level, and not at the functional module level. This process also requires the use of high melting point metals and a subsequent sintering of inorganic materials.

Another welding process for repairing of opens is discussed in, "Circuit Repair/Work of Metallized Polyimide Substrates," IBM Technical Disclosure Bulletin, Vol. 22, No. 9, page 3986 (February 1980). A piece of wire is jumpered across the open and both ends of the jumpered wire are welded to the circuit line, thus yielding a "continuous electrical line." This process also discloses the use of high melting point metals.

Another method of making circuit repairs is disclosed in, "Tailless Thermo-Compression Bonding," IBM Technical Disclosure Bulletin, Vol. 27, No. 5, page 3041 (October 1984), where the circuit line is repaired by passing an electric current between two electrodes which fuse the circuit line and the repair material together.

"Josephson Package Repair," IBM Technical Disclosure Bulletin, Vol. 26, No. 12, pages 6244–6245 (May 1984), is another example of making repairs. The faulty circuits are cut out by laser scribing, and the repair of an open is done by cutting the bad line next to the pad and using a third wiring level to reconnect to the proper pads. This process has the limitation of requiring photolithographic techniques to form the new wiring level. Furthermore, additional thin film process steps cannot be done after chips, pins etc, have been attached.

Laser deposition methods are also being developed for repairing circuit opens. As disclosed in U.S. patent application Ser. No. 223,487, filed on Jul. 25, 1988, now U.S. Pat. No. 5,182,230, and presently assigned to IBM Corporation, an open circuit is repaired by laser induced electroplating process based on the thermobattery effect. One tip of the open conductor is heated with a laser beam, and a thermobattery is formed between the hot spot (tip of the conductor) and the cold part (normal section of the conductor). The laser heating of the tip induces the conductive material present in the plating solution to be formed at the hot tip. This process is continued until the growth of the conductive material joins the two open ends of the open, and a continuous electrical path is formed.

Another process for interconnecting thin-film electrical circuits is taught in U.S. Pat. No. 4,880,959, and presently assigned to IBM Corporation. Both ends of the existing circuit are partially ablated at the open defect site with pulses from an excimer laser, and then gold metal is deposited by LCVD (Laser Chemical Vapor Deposition). This process makes the repairs right after the thin film deposition, and prior to any subsequent module build (i.e. at the substrate level).

Under some circumstances a laser, as disclosed in U.S. Pat. No. 4,572,941 (Sciaky, et al.), could be used to make spot welds. The laser induced melting can cause structural damage to sensitive dielectrics and adjoining lines.

Still another disclosure entitled "Device and Method for Repairing Conductor Path Breaks by Welding" U.S. Pat. No. 4,418,264, refers to the use of a resistance welding apparatus where there exists a circular central electrode and two semi-circular electrodes on opposite sides of the central electrode. Two power supplies are attached to the electrodes with the central electrode being common. The disclosure states that in one operation current flows through the electrodes and welds a tab to two lines as a repair process. It further states that a clock is incorporated in the device to switch the current from one outside electrode to the other and back again many times during the weld. This is because current would take the path of least resistance and create uneven/non-uniform melting of both tabs if a true simultaneous operation was tried.

IBM Disclosure, Vol. 18, No. 12, p. 3984 (May 1976) entitled "Individually Controllable Wire Solder Reflow Bonding Tip," is similar to U.S. Pat. No. 4,418,264, in that it also uses two power supplies to solder reflow two wires by using three (3) electrodes, one being a common.

These two documents refer to resistance welding using complex devices to melt metal wires or tab in place for the purpose of making electrical connections. Once again welding is too harsh a process to be used on a multilevel polymer/thin film package. The use of two power supplies, one for each end of the connection, does in fact simulate the conventional stitch bond approach so vastly used throughout the electronics industry.

On the other hand the invention of this Patent Application discloses "simultaneous electrical connection" which is making an electrical connection between two separate pads and/or lines by simultaneously ultrasonically bonding each end of a wire staple during one bond cycle.

Among other things, the invention of this Patent Application describes an electrical connection process after active and passive components may have been attached to the substrate. This can be done by using a micro-wire or staple and simultaneously securing it to two or more electrical pads or connections, and forming an electrically continuous path. The attaching of the micro-wire or staple can be accomplished by using brazing, ultrasonic bonding, lasersonic bonding, thermo-compression bonding or any combination of these methods. The term "lasersonic bonding" refers to a known process of bonding a member by applying both laser and sonic energy to the member, for instance, as disclosed in U.S. Pat. No. 4,534,811.

The process of this invention allows electrical connection to be accomplished in one step which is another advantage over the other methods.

This process is novel in that it enables the electrical connection and rerouting of electrical lines after the module has been built.

The present invention relates generally to a new method of making electrical connections on high density electronic packaging. Various methods of making electrical connections are used throughout the industry such as solder connections, pluggable or contact connections, as well as ultrasonic, lasersonic, thermocompression and micro surface welding. This invention focuses on, but is not limited to, the simultaneous bonding of a wire connector to two separate and distinct bond pads for the purpose of creating a functional electrical net. The bond pads can be part of a multilevel polyimide, thin film structure.

OBJECTS AND SUMMARY OF THE INVENTION

The invention is a novel method for making simultaneous electrical connections at different levels of build without impacting the structural integrity of the package, or the functionality of devices.

One object of this invention is the fabrication of functional electrical circuits by simultaneously attaching electrical connectors (staples) between specific pads or lines.

Another object of this invention is to restore an electronic package to full electrical functionality by simultaneously reconnecting an electrical path across a section of lines that was selectively opened or laser deleted in earlier processing.

Another object of this invention is to enable an electrical connection across a previously continuous electrical conductor which has developed defects during subsequent processing.

Still another object of this invention is to enable simultaneous electrical connection in the presence of active components such as, chips, and passive components such as, capacitors, pins, discrete wires, etc.

Another object is to allow simultaneous electrical connection of thin film lines on top of organic dielectric materials, such as polyimides.

Another object of this invention is to allow a "dry" method of performing the simultaneous electrical connection, using ultrasonic or related bonding methods to electrically connect across conductor lines.

Another object of this invention is to carry out the simultaneous electrical connection in a localized area without affecting any other portions of the conductor line.

Another object of this invention is to fabricate simultaneous electrical connections across thin film lines or pads without affecting the underlying or surrounding polymers or dielectrics.

Another object of this invention is to produce a metallurgical bond between the conductor line and the electrical pad without melting the conductor line.

Another object of this invention is to connect segments of X and/or Y buried EC lines by simultaneously electrically connecting two junction terminals or pads on the surface of the module.

Another object of this invention is to simultaneously form an electrical path across two or more electrical lines and fabricate a planar structure, so that subsequent processing would allow the fabrication of additional wiring layers.

In one aspect the invention comprises a method of simultaneously forming an electrically conductive path across at least two electrically conducting lines or pads comprising the steps of,
(a) site dressing at least a portion of at least two of said electrically conducting lines or pads,
(b) placing a segment of an electrically conductive material over at least a portion of each of said site dressed portions of said electrical lines or pads, and
(c) simultaneously securing said segment to said at least two electrical lines or pads, thereby forming said electrically conductive path.

In another aspect this invention comprises a bonding tip for creating a simultaneous electrical connection across at least two terminals using a staple, wherein said bond tip has a bonding surface and an attachment surface, and wherein said attachment surface, and is secured to an ultrasonic horn, and wherein said bonding surface has at least two work grooves to hold at least a portion of said staple to form said simultaneous electrical connection across said at least two terminals.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
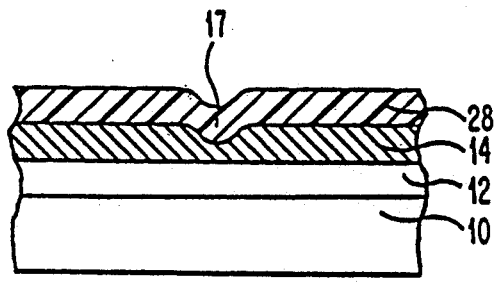
FIG. 1A, illustrates a conductor line having a defect because of a mouse bite.

This invention describes various methods of making simultaneous electrical connections between lines and/or pads and across opens and near opens and latent defects in electrical conductor lines.

This invention also describes a method of making an electrical connection from a C-4 (controlled collapsed chip connection) tab within the chip area to an engineering change (EC) pad outside the chip area net. The method involves the simultaneous bonding of a wire staple between two thin film top surface pads strategically placed between the chip microsockets. One pad is attached to a thin film line which extends between the C-4's terminating at large EC pads outside the chip area, while the other pad extends from the C-4 microsocket and aligns and registers with the line pads.

The restoration of an electrical path after it has been deleted, is also discussed using the simultaneous staple bond of this invention.

Staple bonding as used herein means the simultaneous securing of an electrical connection between two pads, two lines or a pad and a line for the purpose of creating or completing an electrical circuit. This would include making an electrical connection across a defect or open in a thin film line. Staple as used herein means a short piece of an electrical connection that is simultaneously bonded using the staple bonding process. The media that could be used to form this staple could be a wire, a decal or a preform to name a few.

The term latent defects as used herein, means a small portion or section of a conductor line which has a higher resistance per unit length than the normal conductor line. The narrow neck can be of a different shape, for example, the narrow neck could be a local reduction in the line width or a local reduction of line height or thickness or a portion of the line may be made of a material with lower conductivity than that of a normal line. The narrow neck could also include a thin electrical connection or a bridge across an open circuit, or a crack which before stressing does not show up as an open.

An open as understood in the art, is any missing conductor across which current cannot flow or is significantly impeded. This typically establishes a resistance threshold above which the electrical conductive path is considered open.

The defects or flaws as discussed in this patent application are primarily in a thin film packaging structure with or without the discrete components being mounted.

Thin film is a term currently used by the industry to define lines that are formed on a substrate or a carrier that have a very small dimension (of the order of a few micrometers). Thin films are so small that they can only be clearly seen using a microscope or similar such device. Therefore, the repairs of such conductive lines with such dimensions is equally difficult.

The method as disclosed by this invention is performed at relatively low temperatures, therefore, this method can be used on substrates with metal/polymer thin film wiring, or other organic materials. It can also be applied to printed circuit boards.

FIGS. 1A through 1E, illustrate the common ways of how a defect is formed in a conductive thin film line. A defect caused by a mouse bite is shown in FIG. 1A. On a substrate 10, having an insulator layer 12, an electrically conductive line 14, such as a thin film line, is formed by any of the methods known in the art, but due to defects smaller than the line dimension, such as process mishaps or contamination, a mouse bite 17, occurs. This mouse bite 17, may not be discovered until after a protective coating 28, has already been applied. In most cases this protective coating 28, is a polyimide layer or some other dielectric or insulator layer. Typically, the electrically conductive material for the thin film line 14, is selected from a group comprising aluminum, antimony, bismuth, chromium, copper, gold, indium, lead, molybdenum, nickel, palladium, platinum, silver, tin, titanium, tungsten, or alloys thereof.

Figure 1B:
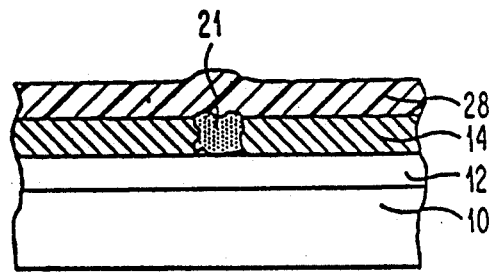
FIG. 1B, illustrates a conductor line being noncontinuous because of debris lodged in the line path.

Another reason that a conductor line could be non-continuous is because of debris lodged in the line path. This is illustrated in FIG. 1B, where a debris 21, prevents the line 14, from being continuous. The debris 21, could be a small dust particle, flake, fiber, or residual process material. Similarly, the debris 21, could create a partial or a complete blockage of the electrical path or the open can be a result of debris being dislodged during subsequent processing. If the blockage is partial then this line problem may not surface until later, while a complete blockage would be detected when an electrical test is done.

Figure 1C:
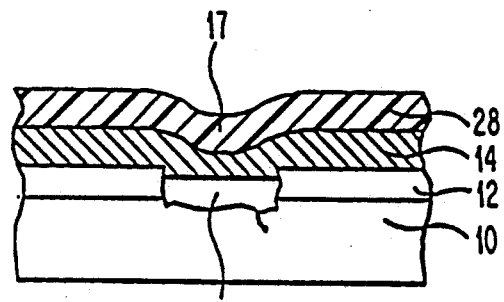
FIG. 1C, illustrates a conductor line having a defect due to a flaw in the substrate.

FIG. 1C, illustrates a conductor line 14, having an open due to a flaw 11, in the substrate 10, and in the insulator layer 12. This flaw typically shows up on the surface as a mouse bite 17. This flaw 11, could be small to only create a partial discontinuity, or a large one making the conductor line 14, completely open.

Figure 1D:
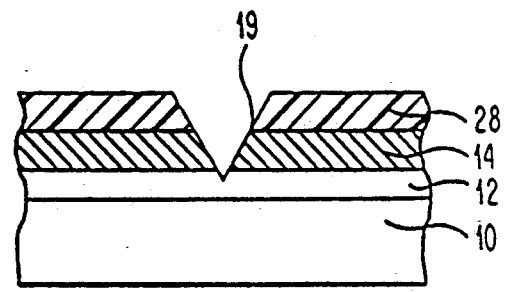
FIG. 1D, illustrates a conductor line being discontinuous as a result of physical damage.

Discontinuities as a result of physical damage of the part is another way to create an open in a conductor line. FIG. 1D, illustrates the electrical conductor line 14, that has had a scratch or a cut or a nick 19, as a result of physical damage, and the scratch 19, has not only damaged the protective coating 28, but has also penetrated through into the substrate 10.

Figure 1E:
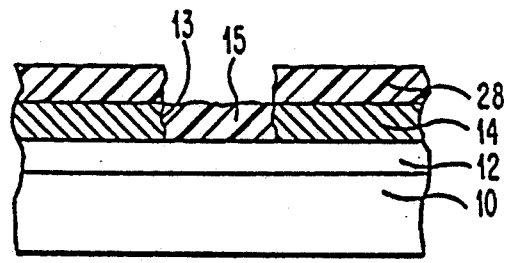
FIG. 1E, illustrates a conductor line having a flaw in the line due to process mishaps.

During processing sometimes the electrical conductor line itself has flaws and discontinuities 13, as shown in FIG. 1E. The conductor line 14, that had the break or flaw 13, in the line 14, due to process mishaps may get fully or partially filled with a protective coating 15, that is used to form the protective coating 28, over the conductor line 14.

In each case where an electrical connection has to be formed, at least a portion of the conductor line 14, or a pad must be exposed and prepared by appropriate methods to allow subsequent repair. This is known as site-dressing. In some situations more than one portion of the electrical line 14, will have to be exposed and prepared. In most situations, only a portion of the electrical line 14, that will be used in the repair process needs to be exposed and site-dressed.

One such cleaning of bonding surfaces using a laser is disclosed in, "Laser Ablative Cleaning of Bonding Surfaces," IBM Technical Disclosure Bulletin, Vol. 32, No. 4A, Pages 429–430 (September 1989), the disclosure of which is incorporated herein by reference.

The fabrication of the modern day substrate or module involves multiple layers or levels of thin films and polymers. The final top layer is a protective coating, typically a polymer, covering all the top surface features except at least portions of the chip C-4's and EC pads. In order to access other locations to be electrically connected, the protective polymer must be removed from that area. This is done by site-dressing, as discussed earlier. Typically the site-dressing is done by the use of an excimer laser which during multiple pulses ablates the polymer off of a predetermined area on both lines and/or pads.

The top surface metal on the pads to be electrically connected is typically gold, and once the polymer is removed, the surface is clean, pure, and ready for simultaneous staple bonding.

Figure 2A:
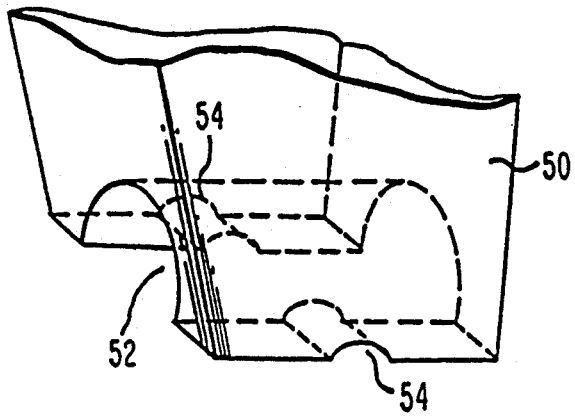
FIG. 2A, is a perspective view of the bond tip according to the teachings of this invention.
Figure 2B:
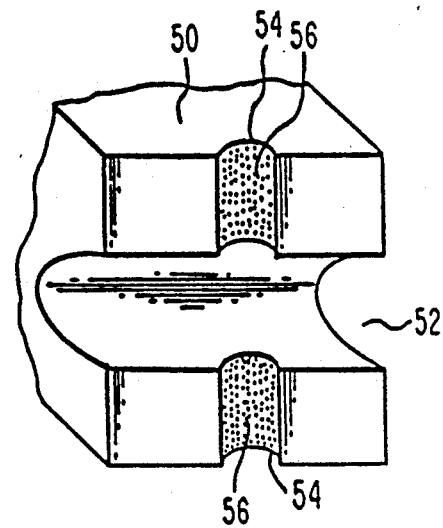
FIG. 2B, is a bottom view of the bond tip of FIG. 2A.

The staple bonding takes place by placing the wire or staple in the work groove 54, of the specially designed bond tip 50, as shown in FIGS. 2A and 2B, such that when the wire or staple is placed in contact with the bonding area the energy, load, and time parameters of the ultrasonic bond process only get to work on a small area of each bonding location. The staple is attached to both pads and/or lines simultaneously during one bond cycle. FIG. 2A, is a front view of the special bond tip illustrating the work groove 54, and the tip gap 52. The tip gap 52, is there so that none of the bond forces are applied to the polymer or thin film pad or line edges, or in other words, the bond forces are only applied to the specific bonding locations.

FIG. 2B, is a bottom view of the special bond tip 50, illustrating the tip gap 52, the work groove 54, and the special work groove texture 56. The work groove texture 56, acts to enhance mechanical coupling between the bond tip 50, and the staple or wire during the simultaneous bonding process.

The special bond tip 50, is typically attached to an ultrasonic bonding horn and extends below the bonding horn a specified distance. The bond tip 50, oscillates or resonates at maximum amplitude when ultrasonic energy is applied to the horn. The distance the bond tip 50, extends below the horn is generally close to but not restricted to $\frac{1}{4}$ or $\frac{3}{4}$ of the resonating SIN wavelength distance, thus producing maximum amplitude at the bottom of the bond tip 50. The energy is transmitted to the horn by attaching a specified number of piezoelectric crystals to the back of the horn such that when a current and voltage are applied to the crystals they resonate at a predetermined frequency. The composition, crystalline structure, thickness and number of crystals are all elements of the resonant frequency. For this application, an IBM model 55 PT piezoelectric transducer (horn) manufactured by Uthe, Inc., Milpitas, Ca., was used along with a matching Uthe Model 10G ultrasonic power supply.

Figure 3:
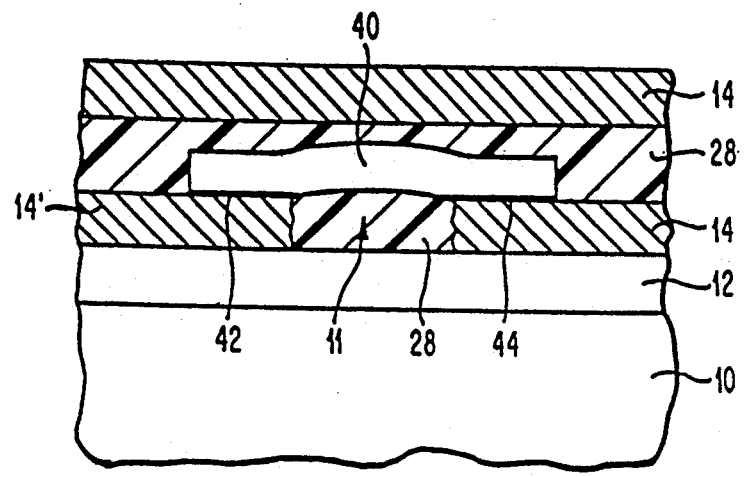
FIG. 3, illustrates further processing of a substrate similar to the substrate of FIG. 1C, after the substrate has been site-dressed and the staple connection has been made according to the invention.

An embodiment of making the simultaneous electrical connection is shown in FIG. 3. The electrically conductive line 14, 14', on the insulator layer 12, has a flaw or defect 11, such as a broken or weak electrical connection in line 14. Once this defect 11, is discovered or identified by electrical test the upper surfaces of the line 14, 14', is site-dressed. The planar staple or jumper wire 40, is made to contact the cleaned upper ends 42 and 44, of the electrical line 14', 14, respectively. Then by any one or more of the methods selected from a group comprising ultrasonic bonding, brazing, thermal compression bonding or lasersonic bonding, the planar staple 40, is simultaneously bonded or secured to the electrical line 14, 14'. In a preferred embodiment a portion of the staple or wire 40, is placed in the work groove 54, of the bond tip 50. The work groove 54, with texture 56, works as a mechanical couple to the staple or wire 40, holds the staple or wire 40, in place while the bond tip 50, is lowered over the upper ends 42 and 44, of the line 14', 14, respectively. Using ultrasonic energy the bond tip 50, is resonated and the wire or staple is simultaneously secured to the upper ends 42 and 44, of the line 14', 14, respectively, in one bonding cycle. The excess portion, if any, of the wire or staple 40, can be cut or trimmed by processes well known in the art. This creates an electrical connection at the bonded interface 42 and 44, at the defective ends of the line 14', 14, respectively. The subsequent insulator or protective coating 28, can then be applied over the bonded area, such that it encloses the planar staple connection. At least a portion of this protective coating 28, could seep into the defective area 11, but this does not harm the already made staple bond. The protective coating 28, if applied, is cured and then could be planarized by methods well known in the art and normal processing is continued, such as the subsequent formation of lines, pads, vias, etc. A second electrically conductive line 14', as shown could then be deposited over the cured and planarized protective coating 28, to make the additional layers for the multilayer module or substrate.

Figure 4:
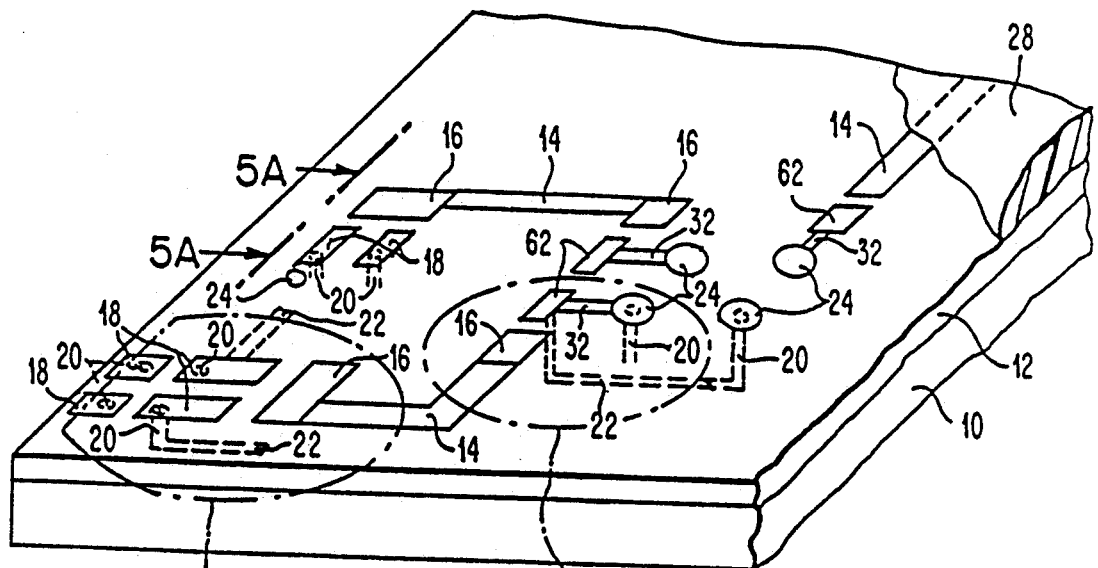
FIG. 4, illustrates a typical substrate having various support elements on the top surface.

FIG. 4, illustrates the elements of a typical electronic package. It contains a single or multilayer substrate 10, insulator layer 12, and a protective coating 28. The top surface electrical conducting features typically consist of C-4 microsockets 24, thin film redistribution or electrically conductive lines 14, electrically conductive pads 16, and buried EC pads 18, and microsocket service terminal (MST) pads 62. The substrate further could have internal vias 20, connecting to internal X-Y planes and buried EC line 22. The microsocket delete straps 32, typically electrically connecting a chip or C-4 microsocket 24, to the MST pads 62. The purpose of the delete straps 32, will be discussed later.

The attachment of the electrical connection or wire or staple 40, can be accomplished in a number of ways. One way is to use thermocompression bonding where a hot tip under a specific load presses the staple 40, into the pads 16 or 18 or 62 or line 14, so that adequate interdiffusion of the staple/pad/line interface takes place simultaneously on both pads/lines.

Another way is to use hot tip soldering, where the staple 40, itself or a solder coating on the staple melts and wets each bond pads 16, 18, 62 or lines 14, 14', and form an electrical connection simultaneously.

Still another way of attaching the staple 40, is with the use of ultrasonic energy, as discussed earlier, whereby the staple 40, is scrubbed on the surface of the lines 14 or 14' or pads 16 or 18 or 62, at high frequency, such as 60-100 KHz generating molecular movement such that molecules on the staples 40, bottom surface mix with molecules on the lines 14 or 14' and/or pads 16 or 18 or 62 top surface, creating a bond simultaneously.

This process requires that both ends of the staple 40, be attached to their respective ends of the lines 14 or 14' and/or pads 16 or 18 or 62 simultaneously. Within the spacial constraints of the C-4 microsockets 24, such as a 80 micron pad on a 200 micron pitch, it becomes necessary to further miniaturize even the smallest of the bonding processes.

Conventional stitch bonding cannot be used here as it requires that a first bond be made followed by a loop and subsequent second bond. And as discussed elsewhere, a second bond in the immediate vicinity of the first bond could have an adverse effect on the already made first bond if stich bonding was used.

The simultaneous attachment of both ends of the staple 40, during a single bond cycle at present is the only way the staple 40, could be placed within the spacial requirements of the chip microsocket geometry. It was also discovered that by simultaneously bonding both ends of the staple 40, a significantly higher reliability was achieved. This is due to the fact that there was no adverse effect of the second bond on the first bond, as both the first bond and the second bond were being made simultaneously, and not sequentially as done in the prior art.

If conventional (stitch) bonding were to be used in close proximity, then the electrical connection that is obtained could be potentially unreliable, because, for example, with ultrasonic bonding the vibration involved while making the second bond would travel through the wire, and disrupt the first bond making it potentially unreliable. Similarly, using the soldering process the second end could melt the already formed first end, again creating reliability concerns. On the other hand, a thermal compression process could also not be used, as it requires heating of the wire sufficiently hot to cause diffusion. These temperatures are usually above the plastic temperature of the polymer which are typically used in the high density electronic packages today, and such temperature would have adverse effects on the electronic package.

The use of ultrasonic energy is the cleanest and most reliable process for simultaneously bonding of wires or staples. Any heat that is generated from ultrasonic scrubbing is on a micro scale and does not affect the surrounding or underlying polymers on the electronic packages. The ultrasonic bond tip 50, incorporating a unique work groove footprint geometry creates the simultaneous bonding of a staple to both pads or lines across a polymer spacing with a high degree of reliability.

In electronic package design two types of staple bond modes of operation could be used. The first is an automatic mode, in which a highly sophisticated robotic tool could place a staple across pads and/or lines. The second mode of operation involves the manual placement of a staple, for the purpose of restoring original electrical functionality by repairing or connecting across laser deletes.

As electronic package density increases, simultaneous staple bonding can be used on the top surface of the modules to make a variety of micro connections between buried engineering change (BEC) pads, between C-4 pads and redistribution lines/pads and between redistribution pad/lines and buried X-Y EC's. Simultaneously bonded staples can also be used to bridge across thin film line defects/opens to restore the line to electrical functionality. Restoration of original electrical circuits by staple bonding over laser deletes in the microsocket delete straps and thin film redistribution line is another use of staple bonding. These pads are typically found at the perimeter of chips or devices. The primary purpose line to another buried signal to complete a functional net.

Figure 5A:
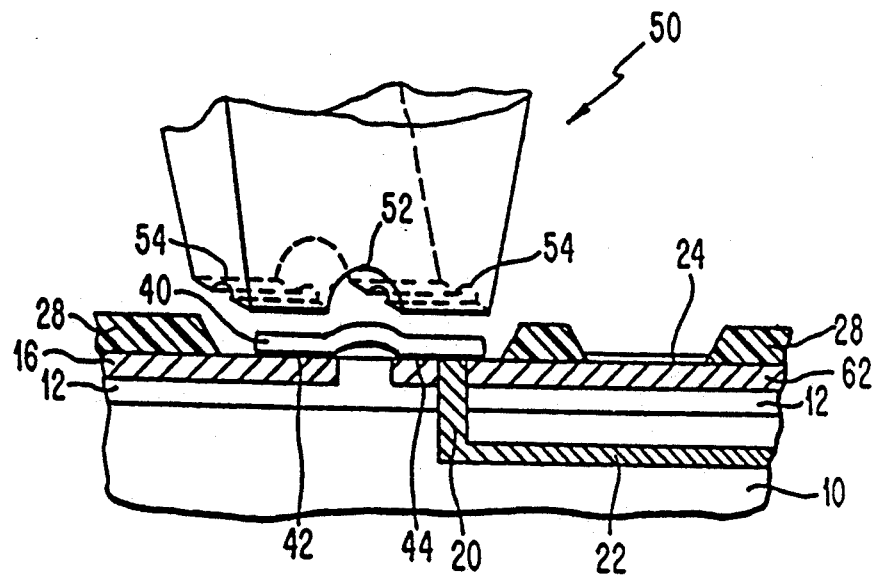
FIG. 5A, illustrates a substrate taken along section 5A-5A in FIG. 4, after a simultaneous electrical connection has been made using a special bond tip of this invention.

An electrical line connection process according to the teachings of this invention is shown in FIG. 5A. The first step is to prepare the site for simultaneous electrical connection as discussed earlier. As shown, the protective coating 28, has been removed, such as by laser ablation, exposing at least a portion of the upper surfaces 42 and 44, of the pads 16 and 62, respectively. This process is called site-dressing as discussed earlier. The upper surfaces 42 and 44, of pads 16 and 62, respectively, must be clean so that at least a portion of the electrically conductive pads 16 and 62, is exposed for subsequent metallurgical bonding. An electrically conductive segment or staple 40, is made using a compatible wire, such as a wire, made from aluminum, copper, gold or alloys thereof. The wire or staple 40, could also be coated with a partial or full layer of material, such as solder or braze "Solder Coating Thin Copper Wire," IBM Technical Disclosure Bulletin, Vol. 11, No. 7, Page 876 (December 1968), gives an example of a wire that is coated with solder that could be used with this invention. The wire or staple 40, is brought in contact with the site-dressed upper surfaces 42 and 44, of the pads 16 and 62, respectively, and using a special tip 50, the staple 40, is simultaneously bonded or attached to the pads 16 and 62. The special bond tip 50, in contact with the staple 40, transfers the energy, load and time bond parameters to specific areas of both pads 16 and 62, creating simultaneously two separate and distinct bond interfaces 42 and 44, in one bond cycle. As can be seen in FIG. 5A, the bonded interfaces 42 and 44, provide a functional electrical connection between the two pads 16 and 62, with a metallurgical bond. The unique or special tip 50, is more clearly described in FIGS. 2A and 2B. In a typical substrate 10, there are internal vias 20, for connecting to X and/or Y planes or BEC lines 22. The BEC lines 22, in FIG. 7 could also connect C-4 microsocket 24, to BEC pads 18, or to X-Y plane or to I/O terminals.

Figure 5B:
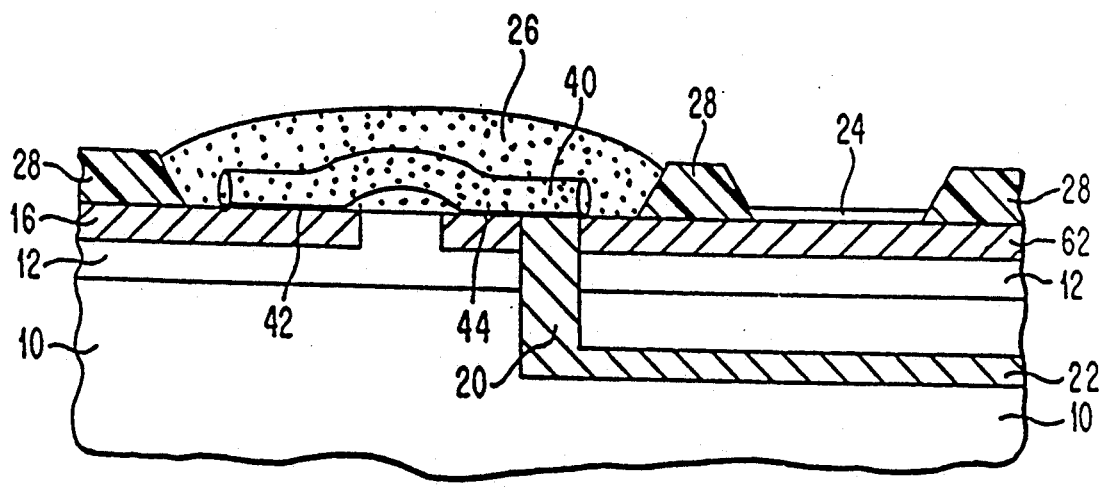
FIG. 5B, illustrates the substrate of FIG. 5A, after a protective coating has been applied.

FIG. 5B, illustrates the substrate of FIG. 5A, after a protective coating 26, such as a polyimide, has been applied. The protective coating 26, is typically a microdrop passivation over the already made simultaneous electrical connection. This micro-drop passivation 26, enhances the reliability of the simultaneous bond by protecting the bond from the environment.

Another way to use the staple or wire to make the simultaneous electrical connection could be between a line and a pad. The process would be similar to the one discussed above.

Figure 6:
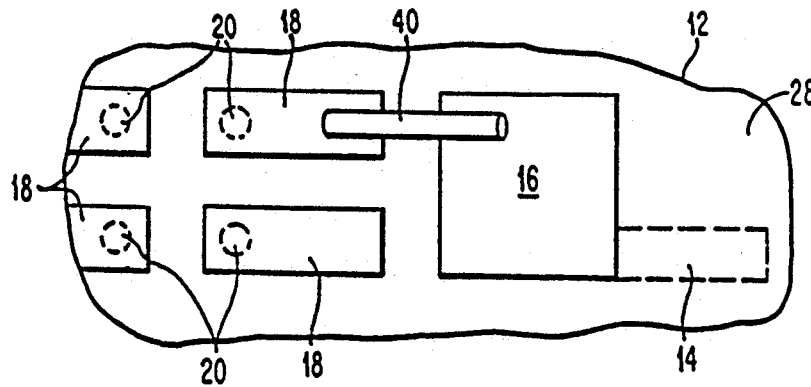
FIG. 6, shows a staple connecting a top surface thin film pad to a top surface buried E.C. pad using the teachings of this invention.

FIG. 6, illustrates the staple connection of the redistribution or electrically conductive pad 16, having electrically conductive line 14, to a buried engineering change (BEC) pad 18. The staple 40, is shown connected to the Y-direction BEC pad 18, but, a similar staple 40, could also be connected to the X-direction BEC pad 18, which could have been used if it was required for that particular functional net. Of course it would be obvious to one skilled in the art to electrically connect one BEC pad 18, to a second BEC pad 18, in either X or Y direction using this invention.

Figure 7:
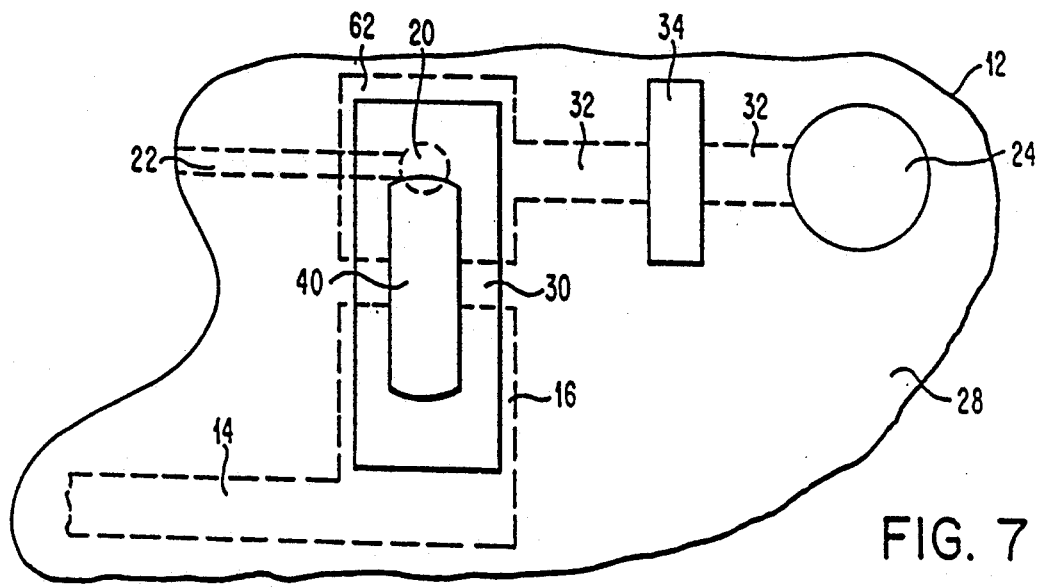
FIG. 7, shows rerouting of an electrical circuit where one path has been deleted and an alternate path has been connected using the staple bonding techniques.

FIG. 7, shows a design for making an electrical connection in the immediate proximity of a chip microsocket 24. The ability to access electrically a C-4 microsocket 24, by making a connection immediately adjoining it has a great advantage in terms of electronic packaging density. The chip microsocket 24, is typically electrically connected to a MST pad 62, using a microsocket delete strap 32. The MST pad 62, is normally connected to a E.C. line 22, through an internal via 20. Electrically conductive line 14, terminates at one end with an electrically conductive pad 16. With the exception of the chip microsockets 24, and BEC pad 18, the entire top surface metallurgy (TSM) is covered with a protective coating 28, such as a polyimide. In order to electrically connect the buried E.C. line 22, to the electrically conductive line 14, the pads 16 and 62, are site-dressed as discussed earlier, and a window 30, over at least a portion of the pads 16 and 62, is opened. The strap 32, is then deleted, creating a delete area 34. This deletion is typically done by laser ablation, isolating the C-4 microsocket 24, from the MST pad 62. The electrical connection of the BEC pad 18, is then made by using a staple 40, and bonding it to the redistribution or electrically conductive pad 16, by the simultaneous bonding method of this invention.

Figure 8:
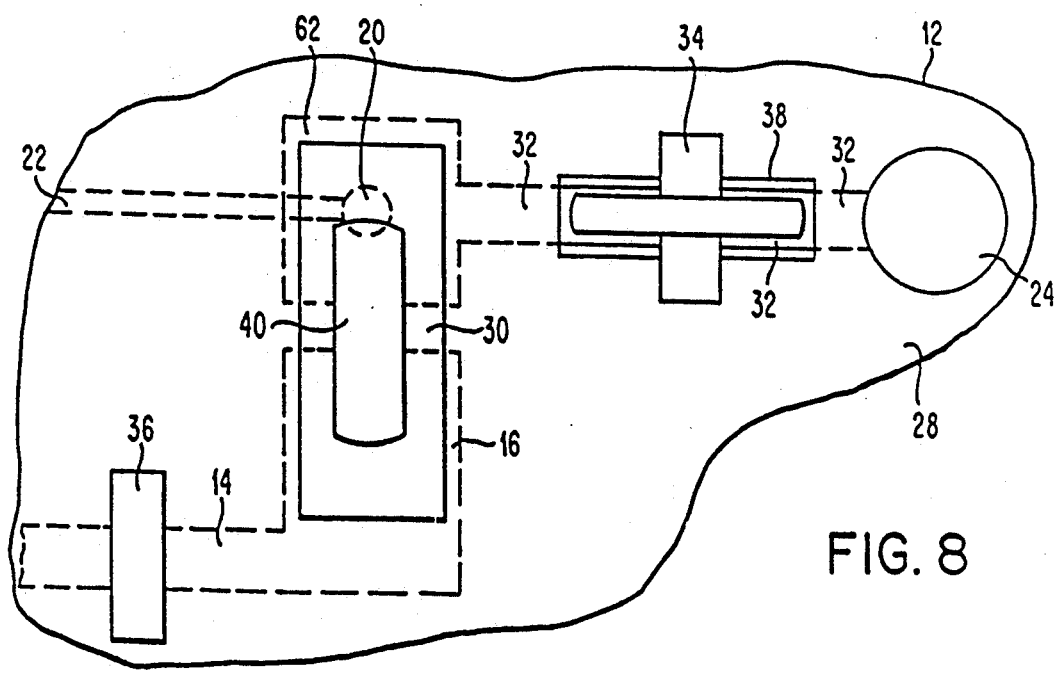
FIG. 8, illustrates the complete restoration of the original electrical net which was rerouted in FIG. 6, according to the teachings of this invention.

FIG. 8, illustrates the restoration of an original functional net of FIG. 7. This can be done, for example, by creating a laser delete area 36, and creating an open in the redistribution or electrically conductive line 14, and isolating the initial staple 40, that electrically connected the line 14, to the BEC strap 32, at the laser delete area 34, is created and site-dressed. A wire or staple 40, can then be simultaneously secured to the two site-dressed ends of the delete strap 32, thus restoring the original functional net.

After each of the methods discussed above of simultaneous electrical connection of a line and/or pad, an additional layer of coating material 28, such as an insulator or dielectric, could then be applied over the staple 40. An example of an insulator that could be used could be a polyimide. If further processing of the substrate is desired then this additional coating could be planarized by methods well known in the art.

Therefore, basically the unique process of this invention involves 1) removal of the protective overcoating from a selective area over both ends of the line or pad that have to be bonded such that the area to be electrically connected is site-dressed, 2) simultaneous attachment of a wire, decal or staple to both line and/or pad, and 3) subsequent application of a protective overcoat over the wire or staple and exposed line or pad, to protect the connection from being wet or shorted such as, by solder, during chip or substrate remove/rework steps, and also for providing electrical integrity to the electrical connection.

Each of the methods for simultaneous line/pad connection as disclosed in this invention can be done with active devices, such as chips, or passive devices, such as capacitors, wires or pins, already on the module or substrate and without the need to remove them. Of course, the device under which this simultaneous electrical connection is to be done has to be removed and that device will have to be remounted once the pad or line have been electrically connected.

EXAMPLES

The following examples are intended to further illustrate the invention and are not intended to limit the scope of the invention in any manner.

EXAMPLE 1

A typical example of laser ablating window in the protective overcoat would consist of setting a tool aperture size of 50 microns (wide)×105 microns (long). Sitting the excimer laser energy level to 500 millijoules/$cm^2$, aligning the window over the module's features to be connected and then pulsing the surface 10 to 20 times until all the protective overcoat is ablated away exposing the metal on the top surface metallurgy. The 50×105 microns window ablates an area of approximately 45×50 microns on each pad along with a 15×50 microns gap between pads.

The next step in the process would be to electrically connect the two pads by simultaneously bonding a staple of approximately 18 microns in diameter and 80 microns long to both pads across the gap. This is done by use of a special bond tip groove geometry which attaches with ultrasonic energy each end of the staple to its respective pad. The ultrasonic energy applied here is on the order of 50 milliwatts for approximately 30 millesecs.

Following the simultaneous staple connection and electrical verification by Electronic Module Test (EMT), a protective polymer coating or passivation is applied by micro drop over those staples within the chip microsocket area to insure they remain reliable through subsequent chip place and chip remove operations. The polymer is cured during the subsequent furnace chip join cycle.

Attempts were made to try conventional stitch bonding for this application but were not successful due to the extremely small spatial requirements.

EXAMPLE 2

The protective coating on the redistribution and BEC (X+Y) pads outside the chip microsocket area is generally removed by photolithographic techniques throughout the module surface because the probability of shorting two pads with chip microsocket solder is small. In this case laser ablation of the surface is not necessary and the staple connection from the redistribution pad to the BEC X or Y pad can be readily attached by using the same bonding technique explained in Example 1.

EXAMPLE 3

In the case of restoration of an electrical net, a laser ablation bond window is opened around the laser delete, by removing the protective polymer from areas of the delete strap on both sides of the delete exposing the metallic surface of the line. Secondly, a staple is simultaneously bonded to the line on each side of the delete using the technique explained in Example 1, and then the staple is passivated by polymer microdrop.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of simultaneously forming an electrically conductive path between at least two electrically conducting lines or pads comprising the steps of,
   (a) site dressing at least a portion of at least two of said electrically conducting lines or pads,
   (b) placing a segment of an electrically conductive material over at least a portion of each of said site dressed portions of said electrical lines or pads, and
   (c) simultaneously securing said segment to said at least two electrical lines or pads using a tip having at least one work groove to accommodate at least a portion of said electrically conductive material during this securing process and thereby forming said electrically conductive path.

2. The method of claim 1, wherein said electrically conductive material is selected from a group comprising a wire or a solder coated wire or a decal or a preform.

3. The method of claim 1, wherein the upper surface of one of said at least two electrically conducting lines or pads is laser ablated.

4. The method of claim 1, wherein said at least two electrically conducting lines or pads are in a thin film packing structure.

5. The method of claim 1, wherein a tip having a textured surface simultaneously secures said segment to said at least two electrical lines or pads.

6. The method of claim 1, wherein after securing said segment to said at least two electrical lines or pads, said segment is covered with an insulator material.

7. The method of claim 1, wherein after securing said segment to said at least two electrical lines or pads, said segment is covered with a polyimide material.

8. The method of claim 1, wherein said segment of an electrically conductive material is a staple, and wherein said staple is simultaneously secured to said lines or pads, by a method selected from a group comprising ultrasonic bonding, brazing, thermal compression bonding, or lasersonic bonding.

9. The method of claim 1, wherein at least a portion of said segment of an electrically conductive material is covered with an electrically conductive material having a melting point lower than said segment, and wherein said low melting point electrically conductive material is simultaneously secured to said lines or pads by a method selected from hot gas reflow, furnace reflow, thermode reflow or laser reflow.

10. The method of claim 1, wherein at least a portion of said segment of an electrically conductive material is covered with solder, and wherein said solder is simultaneously secured to said lines or pads by a method selected from hot gas reflow, furnace reflow, thermode reflow, or laser reflow.

11. The method of claim 10, wherein a metallurgical bond is formed between said segment and said lines or pads by melting of said solder.

12. The method of claim 1, wherein at least a portion of said work groove has a groove texture to enhance the mechanical coupling between said tip and said electrically conductive material during said securing process.

13. The method of claim 1, wherein during said securing process of step (c), the surface of said at least one work groove partially envelopes the surface contours of said electrically conductive material.

14. The method of claim 1, wherein said at least one work groove that accommodates at least a portion of said electrically conductive material has a concave profile.

15. The method of claim 14, wherein said concave profile is either an elliptical or a semicircular profile.

16. The method of claim 1, wherein said tip is secured to an ultrasonic horn and wherein said tip extends below said ultrasonic horn close to ¼ of the resonating SIN wavelength distance.

17. The method of claim 1, wherein said tip is secured to an ultrasonic horn and wherein said tip extends below said ultrasonic horn close to ¾ of the resonating SIN wavelength distance.

18. The method of claim 1, wherein said tip has two work grooves that accommodate at least a portion of said electrically conductive material and wherein both of said work grooves are a mirror image of each other.

19. The method of claim 1, wherein said tip has two work grooves that accommodate at least a portion of said electrically conductive material and wherein both of said work grooves are coplanar.

* * * * *